US007599584B2

United States Patent
Hu et al.

(10) Patent No.: US 7,599,584 B2
(45) Date of Patent: Oct. 6, 2009

(54) PLANAR MID-IR INTEGRATED MICROPHOTONICS

(75) Inventors: Juejun Hu, Cambridge, MA (US); Anuradha M. Agarwal, Weston, MA (US); Lionel C. Kimerling, Concord, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 70 days.

(21) Appl. No.: 11/543,333

(22) Filed: Oct. 5, 2006

(65) Prior Publication Data

US 2007/0110358 A1 May 17, 2007

Related U.S. Application Data

(60) Provisional application No. 60/723,869, filed on Oct. 5, 2005.

(51) Int. Cl.
*G02B 6/12* (2006.01)
*G02F 1/01* (2006.01)
(52) U.S. Cl. .................................. 385/14; 359/244
(58) Field of Classification Search ............ 385/14; 359/244
See application file for complete search history.

(56) References Cited

U.S. PATENT DOCUMENTS 4,908,053 A * 3/1990 Nishii et al. ................. 65/389
6,888,973 B2 * 5/2005 Kolodziejski et al. ......... 385/14

2003/0128922 A1 7/2003 Kolodziejski et al.

OTHER PUBLICATIONS

Clement et al., "High index contrast waveguides in chalcogenide glass and polymer" IEEE Service Center, Piscataway, NJ, US, vol. 11, No. 2 Mar. 2005 pp. 539-546.
Slusher et al., "Large raman gain in nonlinear phase shifts in high-purity As2Se3 chalcogenide fibers" J. Opt. Soc. Am. B, vol. 21, No. 6, Jun. 2004, pp. 1146-1155.
Song et al., "Design characterization, and optimization of waveguides based on chalcogenide glasses for biosensors" Proc of SPIE, Chem and Biological Point Sensors for Homeland Defense II, vol. 5585, Dec. 2004, pp. 58-64, XP0002419825 p. 58-64.
"Fabrication and Characterization of Integrated Optical Waveguides in Sulfide CHalcogenide Glasses"; Viens et al., Journal of Lightwave Technology, vol. 17, No. 7, Jul. 1999; pp. 1184-1191.

* cited by examiner

*Primary Examiner*—Jerry T Rahll
(74) *Attorney, Agent, or Firm*—Gauthier & Connors LLP (57) ABSTRACT

A planar mid-infrared (mid-IR) integrated microphotonic platform includes at least one laser performing lasing functions. The at least one laser comprises chalcogenide glass. At least amplifier structure is coupled to the at least one laser for performing optical amplification. The at least amplifier structure comprises chalcogenide glass. At least one waveguide structure is coupled to the at least one amplifier structure for guiding an optical signal in the microphotonic platform. The at least waveguide structure comprises chalcogenide glass. At least one modulator structure is coupled to the at least one waveguide structure for modulating the optical signal. The at least modulator structure comprises chalcogenide glass. At least one photodetector is coupled to the at least one modulator structure for performing photodetecting functions of the microphotonic platform. The at least photodetector comprises chalcogenide glass. At least one optical sensor is coupled to the at least one photodetector for performing optical sensing functions of the microphotonic platform. The at least optical sensor comprises chalcogenide glass.

32 Claims, 9 Drawing Sheets

PLANAR MID-IR INTEGRATED MICROPHOTONICS

PRIORITY INFORMATION

This application claims priority from provisional application Ser. No. 60/723,869 filed Oct. 5, 2005, which is incorporated herein by reference in its entirety.

BACKGROUND OF THE INVENTION

The invention relates to the filed of microphotonics, and in particular to a planar Mid-infrared (MID-IR) integrated microphotonics.

The wide range of the electromagnetic spectrum is definitely one of the key assets of microphotonics. Devices designed and built to work in mid-IR wavelength region (2 µm to 15 µm) offer the advantage of extending the range of microphotonics applications beyond telecommunication wavelengths. Additionally, such devices possess unique properties which enable several new functionalities over and above their telecom wavelength counterparts.

However, compared to the well-exploited telecommunication wavelength windows (e.g. 1.55 µm and 1.31 µm), the mid-IR range has been a relatively unexplored domain and most previous efforts have focused only on mid-IR fibers and related non-planar devices.

SUMMARY OF THE INVENTION

According to one aspect of the invention, there is provided a planar mid-infrared (mid-IR) integrated microphotonic platform. The microphotonic platform includes at least one laser performing lasing functions. The at least one laser comprises chalcogenide glass. At least one amplifier structure is coupled to the at least one laser for performing optical amplification. The at least amplifier structure comprises chalcogenide glass. At least one waveguide structure is coupled to the at least one amplifier structure for guiding an optical signal in the microphotonic platform. The at least waveguide structure comprises chalcogenide glass. At least one modulator structure is coupled to the at least one waveguide structure for modulating the optical signal. The at least modulator structure comprises chalcogenide glass. At least one photodetector is coupled to the at least one modulator structure for performing photodetecting functions of the microphotonic platform. The at least photodetector comprises chalcogenide glass. At least one optical sensor is coupled to the at least one photodetector for performing optical sensing functions of the microphotonic platform. The at least optical sensor comprises chalcogenide glass.

According to another aspect of the invention, there is provided a method of operating a planar mid-infrared (mid-IR) integrated microphotonic platform. The method includes providing at least one laser performing lasing functions. The at least one laser comprises chalcogenide glass. At least amplifier structure is coupled to the at least one laser for performing optical amplification. The at least amplifier structure comprises chalcogenide glass. At least one waveguide structure is coupled to the at least one amplifier structure for guiding an optical signal in the microphotonic platform. The at least waveguide structure comprises chalcogenide glass. Also, the method includes providing at least one modulator structure being coupled to the at least one waveguide structure for modulating the optical signal. The at least modulator structure comprises chalcogenide glass. At least one photodetector is coupled to the at least one modulator structure for performing photodetecting functions of the microphotonic platform. The at least photodetector comprises chalcogenide glass. Moreover, the method includes at least one optical sensor being coupled to the at least one photodetector for performing optical sensing functions of the microphotonic platform. The at least optical sensor comprises chalcogenide glass.

DETAILED DESCRIPTION OF THE INVENTION

The invention proposes the development of a complete mid-IR on-chip optical platform that is capable of mid-IR telecommunications as well as other functionalities. The planar nature of the proposed devices enables monolithic integration with Si electronics and significantly improves device robustness over their fiber counterparts; the CMOS-compatible designs explore the utilization of the asset base of silicon technology to reduce the cost and improve device performance characteristics; and the choice of high-index materials would allow multilevel dense integration, smaller footprint and large free spectral range (FSR).

The term chalcogenides here defines a large family of vitreous materials fabricated from metals and/or nonmetals (As, Ge, Sb) in conjunction with the heavier elements in the oxygen family (the chalcogens S, Se, Te). Due to their excellent infrared transparency and low phonon energies, chalcogenide glasses have already been widely used for mid-IR fibers and fiber-based devices. Moreover, chalcogenide glasses exhibit several interesting properties that can be exploited for the fabrication of photonic devices. Chalcogenide glasses have the largest known third-order nonlinear optical effects (Kerr effect), which is desirable for ultra-fast all-optical switching.

The high refractive index of chalcogenide glasses envisions device size reduction and a compact integration scheme. ChG's also have advantages in that they possess the possibilities of wide refraction index variation depending on their chemical composition, as well as the ability to "tune" other important physical and optical properties. ChG's are also known for exhibiting significant reversible photo-induced refractive index change (PRC), providing post-fabrication device tunability.

Additionally, the polymeric structure of amorphous chalcogenides enables the reduction of device sidewall roughness and scattering loss by low-temperature (typically <400° C.) thermal reflow, a technique which has been utilized to fabricate ChG microlens arrays. In particular, the thermal reflow is a process in which glass or polymer materials or devices are annealed above their glass transition temperature in order to induce morphological modifications due to the materials' surface tension. Also, this process has successfully been utilized to remove surface roughness on chalcogenide type structures resulting from patterning processes. A typical reflow process includes annealing of the chalcogenide structures at a temperature ranging from 250° C.-500° C. for a time of a few minutes to a few hours. Thermal reflow also provides significant device tolerance to defects in microfabrication processes.

A number of chalcogenide planar photonic devices such as waveguides, Bragg reflectors and microlens arrays have been successfully fabricated with its mature processing technology. Chalcogenide films can be deposited by various methods including thermal evaporation, sputtering, Pulsed Laser Deposition (PLD) and Chemical Vapor Deposition (CVD). Devices can be defined by either wet etching or plasma dry etching. Previous studies have shown that optical waveguides in As—S—Se-based ChG's can be fabricated by several techniques, including photolithography, ion implantation, and laser beam writing. ChG's are also potential candidates for applications in reversible optical recording, as integrated optical elements, memory switching, inorganic photoresists and antireflection coatings.

Photosensitivity of chalcogenide films can be exploited to further simplify device fabrication process. Direct laser writing of photonics structures in transparent optical media is drawing considerable attention since the development of femtosecond lasers and the recognition of their ability to change the properties of optical materials. Non-linear absorption in ChG's induces structural changes leading to the creation of 3-dimensional structures, active device in waveguide or complete optical systems on a single chip. It is now recognized that these processes and effects can be utilized to make a number of interesting and potentially useful micro-devices.

Rare earth (RE) ions possess numerous transitions in mid-IR range that can be utilized for optical amplification or laser. Chalcogenide glasses have been selected as host material for rare-earth ions due to several desirable material properties: (1) Excellent IR transparency that allows IR fluorescence emissions beyond 2 μm, which is prohibited in silica; (2) very low phonon energy which suppresses multiphonon quenching; (3) good rare-earth solubility and (4) electrical conductivity suggesting the possibility of electrical pumping. Non-planar chalcogenide laser has been realized in Nd-doped Ga:La:S glass and optical amplification has also been demonstrated using Nd at 1.08 μm and Pr at 1.31 μm. In addition, chalcogenide glasses have large Raman coefficient, showing promise for Raman amplifiers and lasers.

Figure 1A:
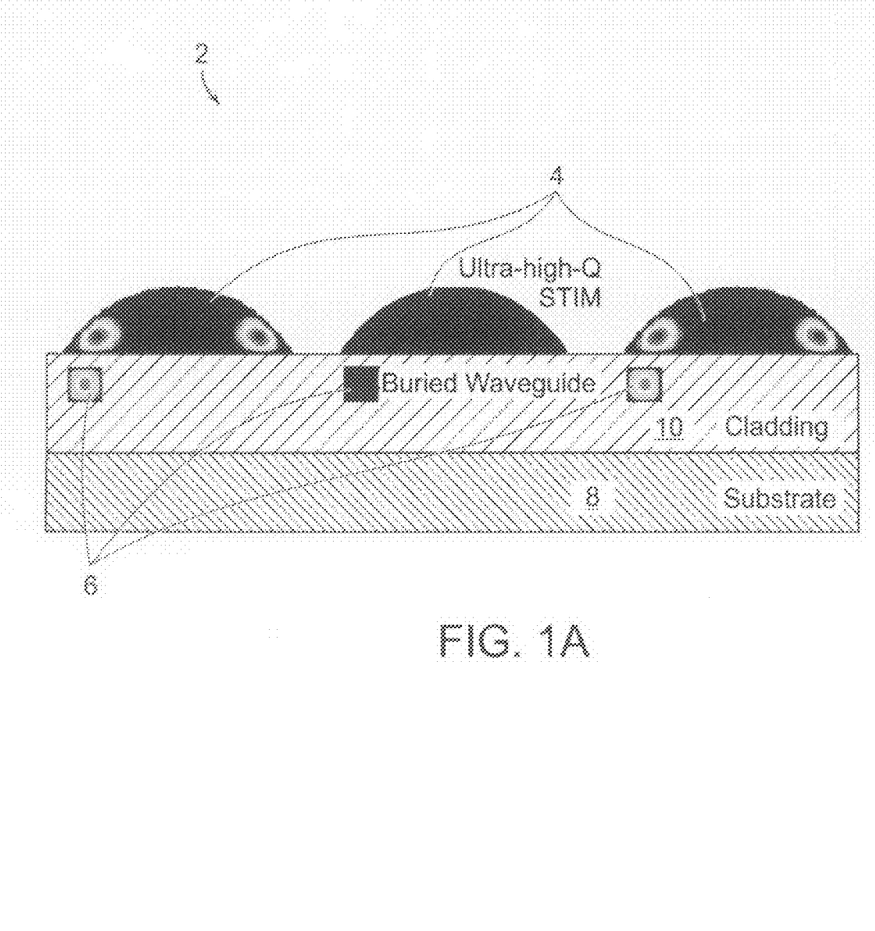
FIG. 1A is a schematic of a rare earth doped chalcogenide laser based on novel all-on-chip ultra-high-Q STIM design.
Figure 1B:
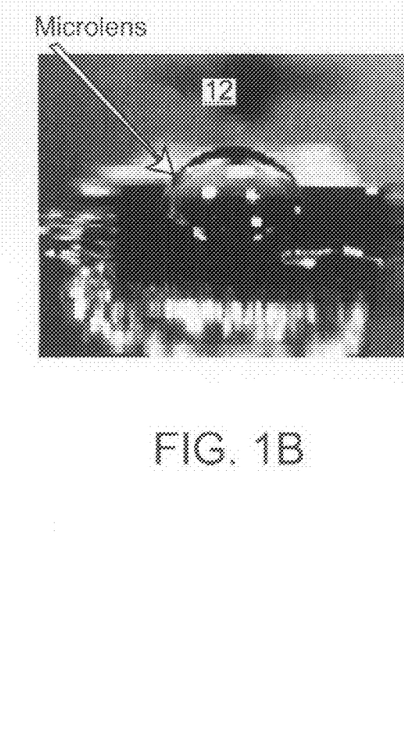
FIG. 1B is a TEM diagrams illustrating a microlens being fabricated using the thermal reflow process.

Here, the invention proposes the use of on-chip ultra-high-Q surface tension induced microcavity (STIM), which can be formed by thermal reflow of RE-doped chalcogenide glass mesas defined by photolithography, to decrease cavity loss and achieve lasing action in mid-IR wavelength range. FIG. 1A shows a schematic of a rare earth doped chalcogenide laser 2 based on novel all-on-chip ultra-high-Q STIM design. The laser 2 includes ultra-high Q STIM structures 4 formed on a cladding layer 10. Note the cladding layer 10 includes buried waveguide structures 6 formed within. The cladding layer 10 is formed on a Si substrate 8. FIG. 1B shows a microlens 12 being fabricated using the thermal reflow process.

Figure 2A:
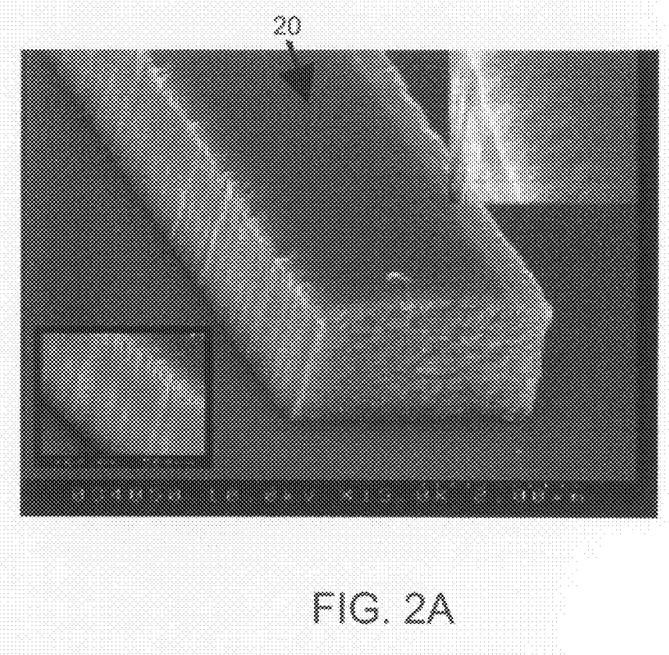
FIG. 2A is a TEM diagram of a low-loss $As_2S_3$ waveguide fabricated by plasma dry etching.
Figure 2B:
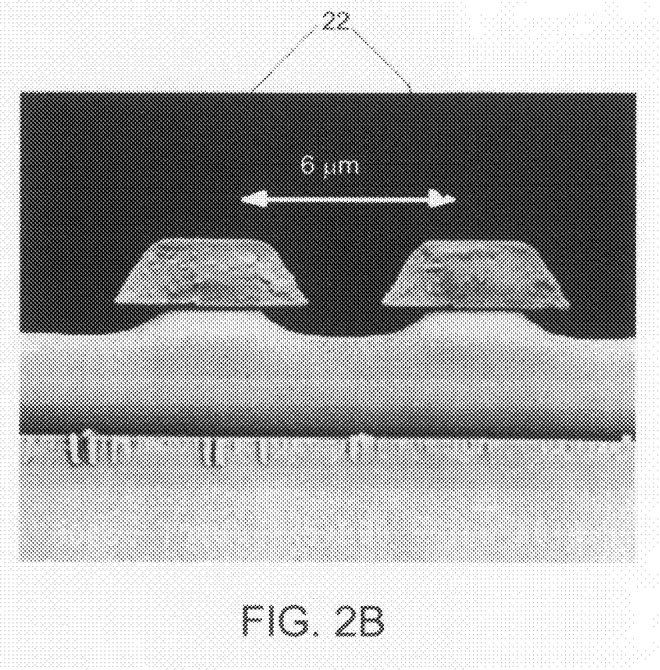
FIG. 2B is a TEM diagram of an $As_2S_3$ waveguide defined by wet chemical etching.
Figure 2C:
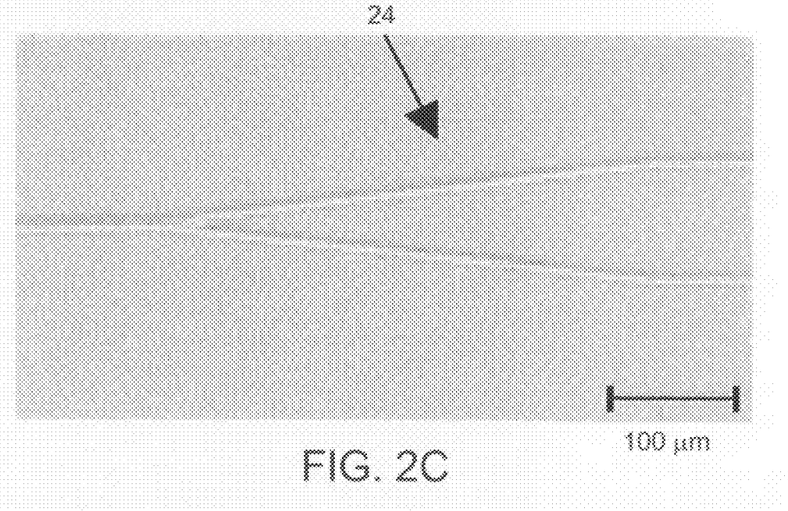
FIG. 2C is a TEM diagram a Y-splitter patterned by femtosecond laser direct writing.

By composition tuning, chalcogenide glasses can exhibit transparent windows extending from visible to far-IR, which combined with their high refractive index make ChG's ideal material candidates for mid-IR on-chip waveguides for dense device integration. Planar waveguides have been fabricated in a number of different chalcogenide glass matrices with loss smaller than 1 dB/cm. The invention uses waveguide fabrication techniques including photolithography, soft lithography and laser direct writing, thermal reflow treatment to further decrease waveguide loss, as well as the development of related planar devices such as directional couplers, splitters and interferometers and their integration to other on-chip devices. FIG. 2A shows a SEM diagram of a low-loss $As_2S_3$ waveguide 20 fabricated by plasma dry etching. FIG. 2B shows a SEM diagram of an $As_2S_3$ waveguide 22 defined by wet chemical etching, and FIG. 2C shows a Y-splitter 24 patterned by femtosecond laser direct writing.

Figure 3:
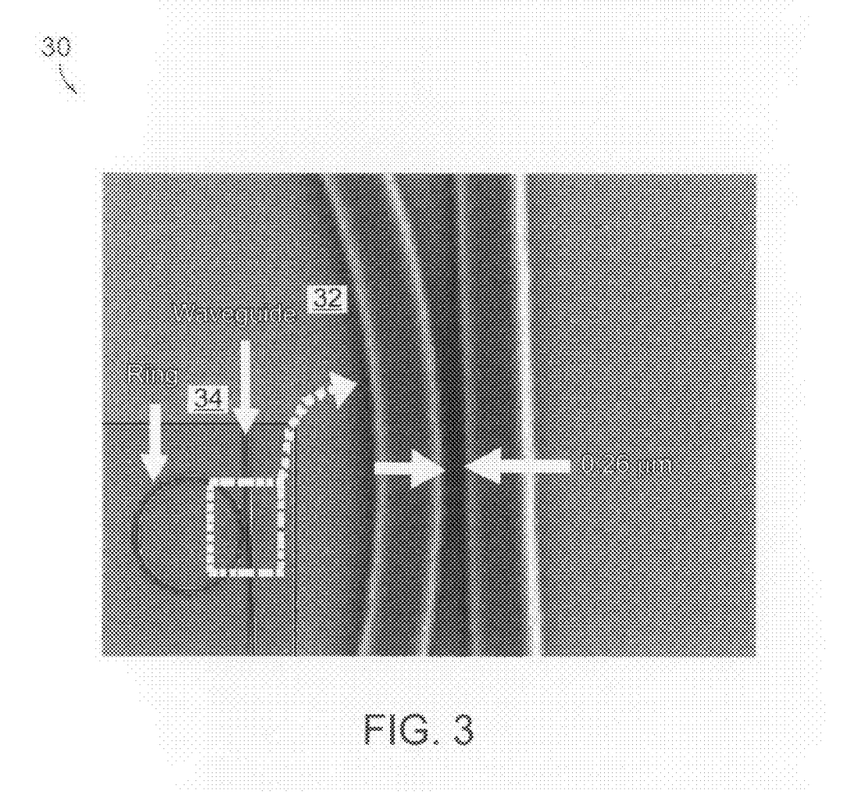
FIG. 3 is a TEM diagram of an all-optical switch working at 1.55 µm based on a Si ring resonator.

FIG. 3 is a SEM diagram of an all-optical switch 30 working at 1.55 μm based on a Si ring resonator 34. The all-optical switch also includes waveguide 32. Optical switching devices can either employ an interferometer configuration or a microring resonator scheme. ChG-based optical switching using Mach-Zehnder geometry has been reported. All-optical switching based on ring resonators has unique advantages over interferometer switching schemes in that it offers small switching threshold, compact device design and hence dense integration. Note these the optical switch can be used to form a modulator structure.

Microring resonators performing all-optical switching at 1.55 μm have been demonstrated in both Si and other compound semiconductors. However, due to their large optical nonlinearity and mid-IR transparency, chalcogenide glasses are superior material candidates for all-optical switching and modulation in mid-IR region. In, the invention provides a ring resonator switch design, reversible PRC effect of ChG's will be utilized for DC switching, and the high optical nonlinearity of chalcogenide glasses will serve to decrease the switching threshold for ultra-high-speed applications. The thermal reflow technique will be introduced to reduce sidewall roughness and thus lift the stringent requirement on ring fabrication.

Limited by their relatively large material bandgap, traditional CMOS detector materials (Si and Ge) are unable to extend their detection wavelength into mid-IR. Thus most current mid-IR detectors are based on single-crystalline compound semiconductors grown by molecular beam epitaxy (MBE) or metal-organic chemical vapor deposition (MOCVD). These detectors suffer high fabrication cost, low device yield and incompatibility with Si VLSI technology.

According to previous theoretical and experimental investigations, $Ge_{1-x}Sn_x$ alloy exhibits a shrunken bandgap with increasing Sn incorporation and also undergoes an indirect-direct bandgap transition, which shows great promise as a CMOS-compatible mid-IR detector material. Despite the tendency of Ge—Sn phase segregation, there have been precedents of obtaining single-crystalline Ge—Sn alloys and superstructures, but no device application has been reported so far.

Figure 4A:
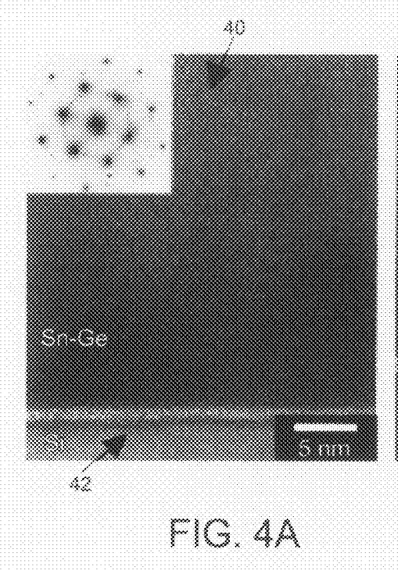
FIG. 4A is a TEM diagram showing an As-grown Ge—Sn film on Si substrate by UHVCVD.
Figure 4B:
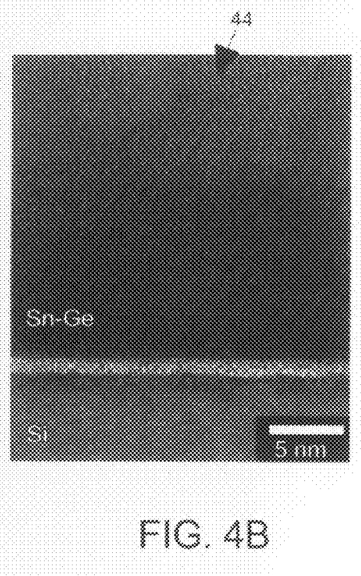
FIG. 4B is a TEM diagram showing an As-grown Ge—Sn film with improved crystallinity after 400° C. annealing.
Figure 4C:
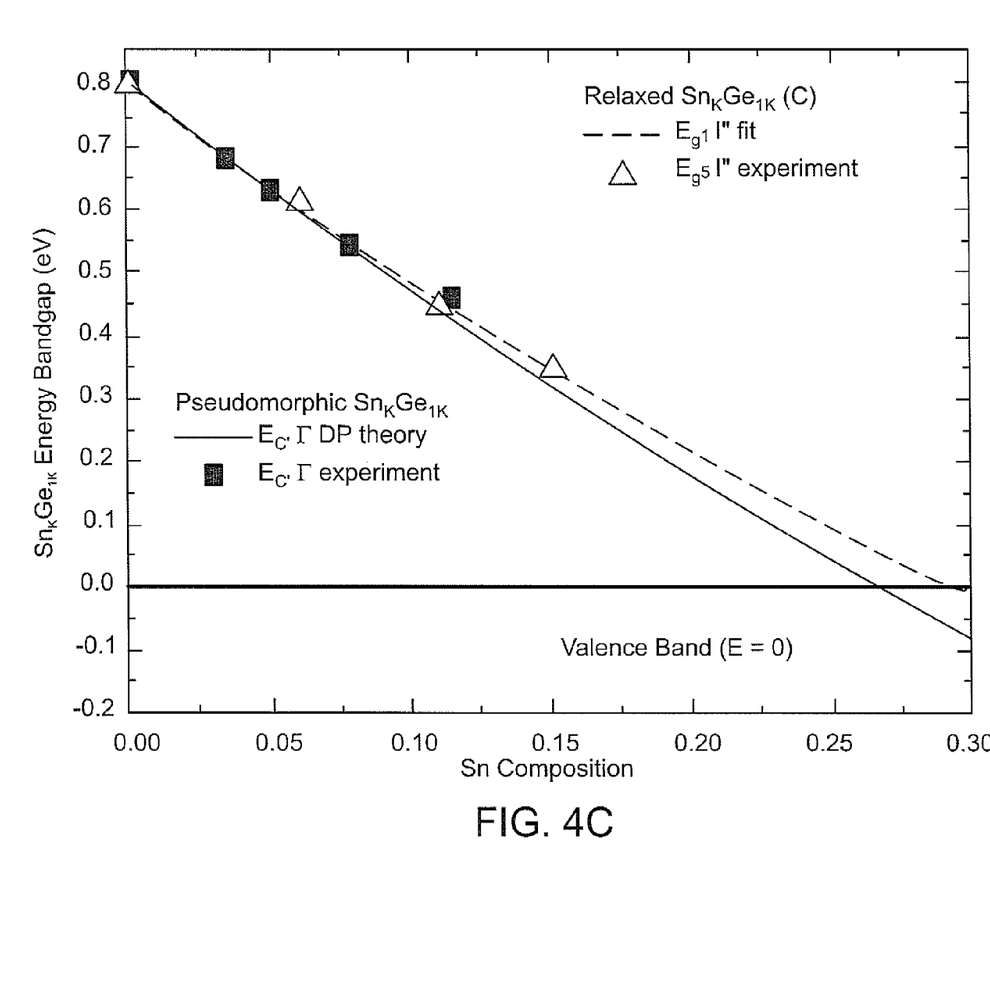
FIG. 4C is a graph showing the bandgap shrinkage of single crystalline Ge—Sn alloy deposited by MBE and comparison with theoretical results based on pseudomorphic model.

However, FIG. 4A shows an As-grown Ge—Sn film 40 on a Si substrate 42 by UHVCVD. FIG. 4B shows an As-grown Ge—Sn film 44 with improved crystallinity after 400° C. annealing. FIG. 4C shows the bandgap shrinkage of single crystalline Ge—Sn alloy deposited by MBE and comparison with theoretical results based on pseudomorphic model.

Compared to the existing expensive Ge—Sn single-crystal growth methods such as MBE or UHV-CVD, sputtering or evaporation deposition of polycrystalline or amorphous GeSn alloy still remains unexplored, which potentially opens up the possibility for cost-effective mid-IR detection. Besides its functionality as a mid-IR circuit component, implementation of low-cost Ge—Sn mid-IR detectors in a focal plane array (FPA) for thermal imagers will also enable numerous cost-sensitive applications such as night vision goggles, fire-fighting cameras and security surveillance.

Direct laser writing of photonics structures in transparent optical media is drawing considerable attention since the development of femtosecond lasers and the recognition of their ability to change the properties of optical materials. One of the principal applications of this technology is for the fabrication of optical devices. The use of focused femtosecond laser pulses to produce structural modification in optical glasses is now well known. In this regime the focused intensity within the material must reach a certain value, depending on the material, for a structural change to occur. Exposed at intensities below ablation threshold, many materials exhibit non-linear absorption. This induces some structural changes, either in the surface or in bulk material leading to the creation of 3-dimensional structures, active device in waveguide or complete optical systems on a single chip.

Exposure to laser exceeding ablation threshold results in the formation of pitches or channels on material surface, making it possible to define micro-fluidic channels on glass surface. A combination of laser direct-written waveguides and micro-channels defined by laser ablation can be utilized to make a number of interesting and potentially useful micro-devices in optofluidics and sensor applications.

Figure 5A:
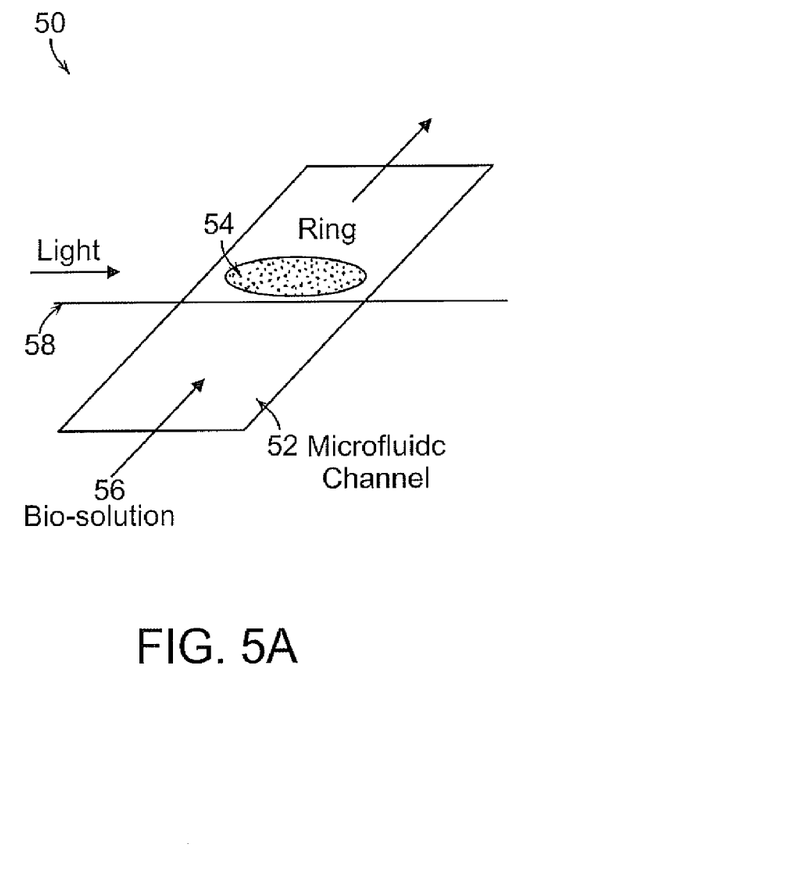
FIG. 5A is a schematic diagram of a biosensor device integrated with microfluidic channel.
Figure 5B:
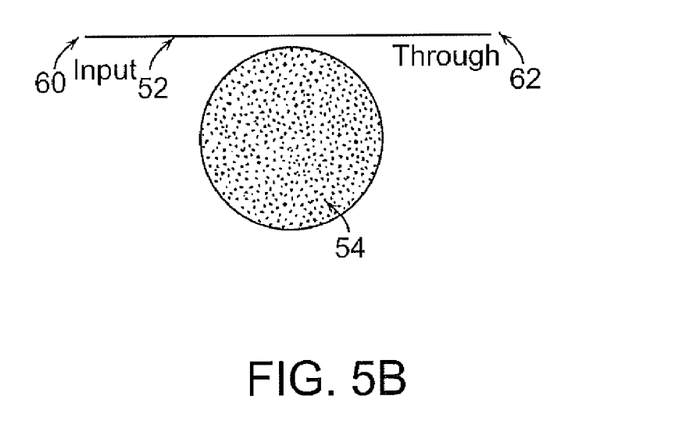
FIG. 5B is a schematic diagram of a top view of a microring/microdisk resonator evanescently coupled to an input waveguide.
Figure 5C:
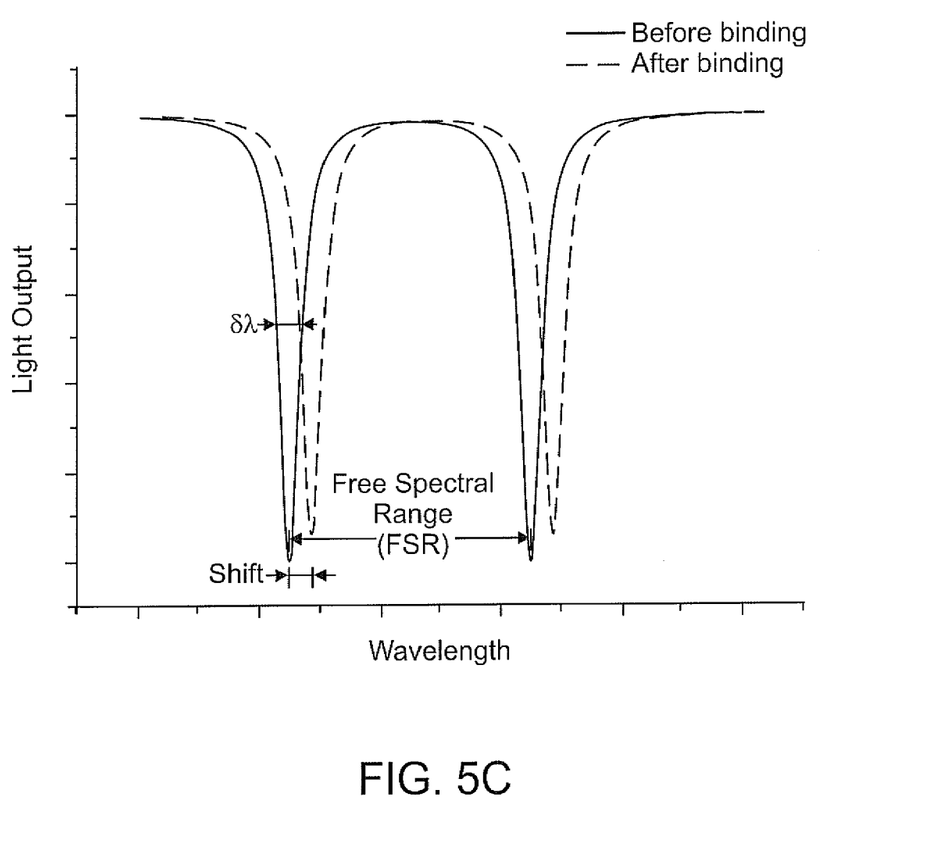
FIG. 5C is a graph illustrating an optical resonator sensor device spectral response before and after cell/molecule binding.

Compared to high-cost and extremely time-consuming (a significant incubation time is often required) traditional bio-sensing techniques, optical sensors feature a low-cost, compact, multiplexed and highly automated detection scheme. FIG. 5A shows a schematic diagram of a biosensor device integrated with microfluidic channel. The biosensor also includes a microring resonator 54. A bio-solution 56 passes perpendicular the microfluidic channel 52, which guides an optical signal 58. The interactions between the microring resonator 54, microfluidic channel 52, and bio-solution 56 produces a specific optical spectral response. FIG. 5B shows a top view of the microring resonator 54 evanescently coupled to the microfluidic channel 52. Note the microfluidic channel 52 includes an input port 60 and an output port 62. FIG. 5C shows an optical resonator sensor device spectral response before and after cell/molecule binding.

In addition, a key advantage of optical biosensors is that data may be collected in real time, enabling efficient anti-bioterrorism security surveillance and also providing detailed information about a binding reaction in the biotic-abiotic interface. Currently, most optical sensors are based on evanescent field detection, which measures the change in refractive index near the surface that occurs during cell/molecule surface binding.

Since evanescent field decays exponentially from the sensor surface into the sample volume, only changes within the penetration depth of the optical field are detected. For most on-chip waveguides, the field decay length is limited to 100-200 nm. Thus, for a bacterial cell or aerosol particle typically with a size of a few microns, only a very small fraction of the cell is probed, resulting in a severe reduction of sensitivity. A number of solutions have been proposed, however, none of them has resolved this issue satisfactorily.

The invention proposes the utilization of chalcogenide glass based microring/microdisk resonator as sensitive mid-IR sensors for biomolecules, microorganisms and aerosols. Chalcogenides can be used either as the waveguide material for evanescent sensing of absorptive chemical species by virture of the IR transparency of chalcogenides, or as the resonator material for refractive index sensing of molecular binding taking advantage of the thermal reflow process.

Besides the advantages of optical sensors, the inventive system features several other desirable characteristics: (1) IR-transparency of chalcogenide glasses enables device operation in mid-IR region, which combined with streamlined design of photonic waveguide structures increase the penetration depth of evanescent optical field. Optical resonance in the ring resonator induces strongly enhanced light-matter interaction, leading to a dramatic improvement of sensor sensitivity. Thermal reflow technique can be introduced to reduce sidewall scattering and further increase the device quality factor. Compared to fiber sensory systems, the on-chip nature and CMOS-compatibility of the proposed device will improve system robustness and envision monolithic integration with peripheral photonic and electronic circuits.

Figure 6:
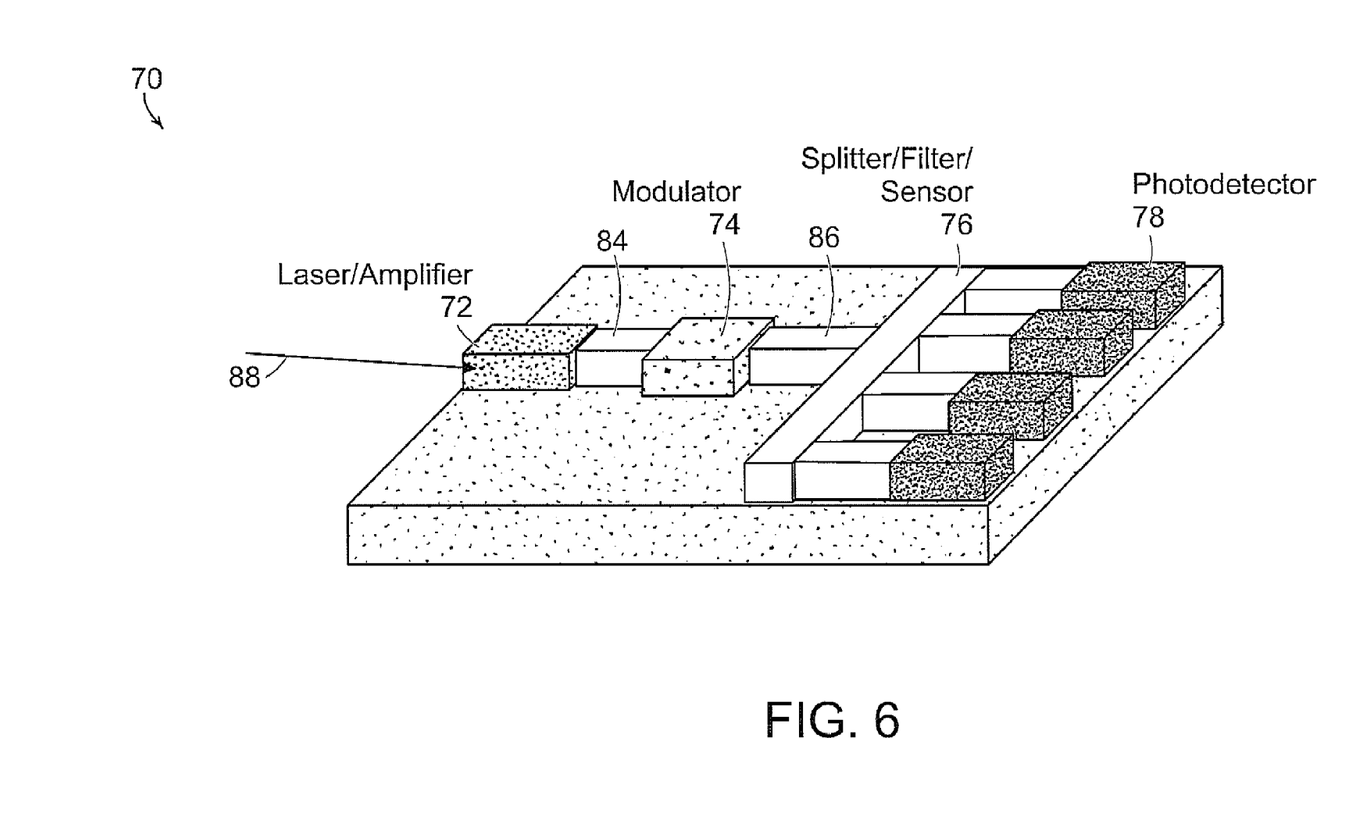
FIG. 6 is a schematic diagram illustrating an inventive mid-IR on-chip optical platform.

FIG. 6 shows the inventive mid-IR on-chip optical platform 70. The platform 70 includes a laser 72 that receives an optical signal 88 and performs lasing operations on the optical signal 88. The laser 72 is coupled to a modulator 74 by way of a waveguide structure 84. The modulator 74 performs modulation functions on the output signal sent by the laser 72 via the waveguide structure 84. Splitter 76 receives as input the output signal of the modulator 74 via a second waveguide structure 86. The splitter 76 split the received signal into a plurality of different signals having different optical frequencies. Each of these signals are sent to different optical sensors 78 to be processed.

Note all the elements 72, 74, 76, 78, 84, and 86 described herein are similar to those structures 2, 20-24, and 30 described herein. Each of the elements 72, 74, 76, 78, 84, and 86 is exposed to thermal reflow to reduce surface roughness.

Although the present invention has been shown and described with respect to several preferred embodiments thereof, various changes, omissions and additions to the form and detail thereof, may be made therein, without departing from the spirit and scope of the invention.

What is claimed is:

1. A planar mid-infrared (mid-IR) integrated microphotonic platform comprising:

at least one laser for performing lasing functions, said at least one laser comprises chalcogenide glass;

at least amplifier structure being coupled to said at least one laser for performing optical amplification, said at least amplifier structure comprises chalcogenide glass;

at least one waveguide structure being coupled to said at least one amplifier structure for guiding an optical signal in said microphotonic platform, said at least waveguide structure comprises chalcogenide glass;

at least one modulator structure being coupled to said at least one waveguide structure for modulating said optical signal, said at least modulator structure comprises chalcogenide glass; and at least one photodetector being coupled to said at least one modulator structure for performing photodetecting functions of said microphotonic platform; said at least photodetector comprises chalcogenide glass; and at least one optical sensor being coupled to said at least one photodetector for performing optical sensing functions of said microphotonic platform, said at least optical sensor comprises chalcogenide glass; wherein the chalcogenide glass is morphologically modified at its glass transition temperature to remove surface roughness on the various components of said planar mid-IR integrated platform and said microphotonic platform comprising a Si-CMOS-compatible platform.

2. The planar mid-IR integrated microphotonic platform of claim 1 further comprising a working wavelength between 2 μm and 15 μm.

3. The planar mid-infrared (mid-IR) integrated microphotonic platform of claim 1, wherein said at least one laser comprises a ultra-high-Q surface tension induced microcavity.

4. The planar mid-infrared (mid-IR) integrated microphotonic platform of claim 1, wherein said at least one laser comprises rare earth doped chalcogenides being used as gain media.

5. The planar mid-infrared (mid-IR) integrated microphotonic platform of claim 1, wherein said at least one laser comprises the Raman effect for light amplification.

6. The planar mid-infrared (mid-IR) integrated microphotonic platform of claim 1, wherein said at least one waveguide structure comprises a cladding having chalcogenide glass.

7. The planar mid-infrared (mid-IR) integrated microphotonic platform of claim 1, wherein said at least one waveguide structure being defined by photolithography, laser direct writing or soft lithography.

8. The planar mid-infrared (mid-IR) integrated microphotonic platform of claim 1, wherein said at least one modulator structure comprises a chalcogenide ring resonator.

9. The planar mid-infrared (mid-IR) integrated microphotonic platform of claim 1, wherein said at least one modulator structure comprises a nonlinear change of index of chalcogenide glasses upon light illumination.

10. The planar mid-infrared (mid-IR) integrated microphotonic platform of claim 1, wherein said at least one modulator structure comprises photo refractive index change (PRC effect).

11. The planar mid-infrared (mid-IR) integrated microphotonic platform of claim 8, wherein the ring resonator is smoothed through thermal reflow.

12. The planar mid-infrared (mid-IR) integrated microphotonic platform of claim 1, wherein said at least one photodetector comprises polycrystalline or amorphous Ge—Sn alloys for mid-IR detection.

13. The planar mid-infrared (mid-IR) integrated microphotonic platform of claim 1, wherein said at least one optical sensor comprises a bio-sensor.

14. The planar mid-infrared (mid-IR) integrated microphotonic platform of claim 13, wherein said biosensor comprises a chalcogenide microring/microdisk resonator structure.

15. The planar mid-infrared (mid-IR) integrated microphotonic platform of claim 13, wherein said biosensor comprises a chalcogenide ultra-high-Q surface tension induced microcavity.

16. The planar mid-infrared (mid-IR) integrated microphotonic platform of claim 13, wherein said biosensor comprises detection of small refractive index change.

17. A method of operating a planar mid-infrared (mid-IR) integrated microphotonic platform comprising:

providing at least one laser for performing lasing functions, said at least one laser comprises chalcogenide glass;

providing at least amplifier structure being coupled to said at least one laser for performing optical amplification, said at least amplifier structure comprises chalcogenide glass;

providing at least one waveguide structure being coupled to said at least one amplifier structure for guiding an optical signal in said microphotonic platform, said at least waveguide structure comprises chalcogenide glass;

providing at least one modulator structure being coupled to said at least one waveguide structure for modulating said optical signal, said at least modulator structure comprises chalcogenide glass; and providing at least one photodetector being coupled to said at least one modulator structure for performing photodetecting functions of said microphotonic platform; said at least photodetector comprises chalcogenide glass and providing at least one optical sensor being coupled to said at least one photodetector for performing optical sensing functions of said microphotonic platform, said at least optical sensor comprises chalcogenide glass; wherein the chalcogenide glass is morphologically modified at its glass transition temperature to remove surface roughness on the various components of said planar mid-IR integrated platform and said microphotonic platform comprising a Si-CMOS-compatible platform.

18. The method of claim 17 further comprising providing a working wavelength between 2 μm and 15 μm.

19. The method of claim 17, wherein said at least one laser comprises an ultra-high-Q surface tension induced microcavity.

20. The method of claim 17, wherein said at least one laser comprises rare earth doped chalcogenides being used as gain media.

21. The method of claim 17, wherein said at least one laser comprises the Raman effect for light amplification.

22. The method of claim 17, wherein said at least one waveguide structure comprises a cladding having chalcogenide glass.

23. The method of claim 17, wherein said at least one waveguide structure being defined by photolithography, laser direct writing or soft lithography.

24. The method of claim 17, wherein said at least one modulator structure comprises a chalcogenide ring resonator.

25. The method of claim 17, wherein said at least one modulator structure comprises a nonlinear change of index of chalcogenide glasses upon light illumination.

26. The method of claim 17, wherein said at least one modulator structure comprises photo refractive index change (PRC effect).

27. The method of claim 25, wherein the ring resonator is smoothed through thermal reflow.

28. The method of claim 17, wherein said at least one photodetector comprises polycrystalline or amorphous Ge—Sn alloys for mid-IR detection.

29. The method of claim 17, wherein said at least one optical sensor comprises a bio-sensor.

30. The method of claim 29, wherein said biosensor comprises a chalcogenide microring/microdisk resonator structure.

31. The method of claim 29, wherein said biosensor comprises a chalcogenide ultra-high-Q surface tension induced microcavity.

32. The method of claim 29, wherein said biosensor comprises detection of small refractive index change.

* * * * *

UNITED STATES PATENT AND TRADEMARK OFFICE
CERTIFICATE OF CORRECTION

PATENT NO. : 7,599,584 B2
APPLICATION NO. : 11/543333
DATED : October 6, 2009
INVENTOR(S) : Hu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 71 days.

Signed and Sealed this

Twenty-eighth Day of September, 2010

David J. Kappos
*Director of the United States Patent and Trademark Office*